(12) United States Patent
Yamamoto

(10) Patent No.: US 9,985,628 B2
(45) Date of Patent: May 29, 2018

(54) ORGANIC ELECTROLUMINESCENCE MODULE AND SMART DEVICE

(71) Applicant: Konica Minolta, Inc., Tokyo (JP)

(72) Inventor: Natsuki Yamamoto, Kawasaki (JP)

(73) Assignee: KONICA MINOLTA, INC., Tokyo (JP)

(*) Notice: Subject to any disclaimer, the term of this patent is extended or adjusted under 35 U.S.C. 154(b) by 0 days. days.

(21) Appl. No.: 15/119,782

(22) PCT Filed: Feb. 25, 2015

(86) PCT No.: PCT/JP2015/055372
§ 371 (c)(1),
(2) Date: Aug. 18, 2016

(87) PCT Pub. No.: WO2015/129737
PCT Pub. Date: Sep. 3, 2015

(65) Prior Publication Data
US 2017/0063374 A1    Mar. 2, 2017

(30) Foreign Application Priority Data
Feb. 28, 2014 (JP) ................................ 2014-037796

(51) Int. Cl.
*H03K 17/96* (2006.01)
*G06F 3/041* (2006.01)
(Continued)

(52) U.S. Cl.
CPC ........... *H03K 17/962* (2013.01); *G06F 3/044* (2013.01); *G06F 3/0412* (2013.01);
(Continued)

(58) Field of Classification Search
CPC .......... H03K 17/962; H03K 2017/9634; G06F 3/0412; G06F 3/0416; G06F 3/044;
(Continued)

(56) References Cited

U.S. PATENT DOCUMENTS

| 2014/0002385 | A1* | 1/2014 | Ka | ........................ | G06F 1/1601 |
| | | | | | 345/173 |
| 2016/0190522 | A1* | 6/2016 | Lee | ..................... | H01L 51/0097 |
| | | | | | 257/40 |
| 2017/0229489 | A1* | 8/2017 | Seo | ..................... | H01L 27/1218 |

FOREIGN PATENT DOCUMENTS

JP     2004212717 A    7/2004
JP     2011013511 A    1/2011
(Continued)

OTHER PUBLICATIONS

International Search Report dated Apr. 21, 2015 for PCT/JP2015/055372.

*Primary Examiner* — Peter Bradford
(74) *Attorney, Agent, or Firm* — Lucas & Mercanti, LLP

(57) ABSTRACT

An object of the present invention is to provide an organic EL module that achieves a reduction in size and thickness, that has a high touch-sensing accuracy, and that is applicable to smart devices, and a smart device equipped with the same. The organic EL module of the present invention includes: an organic EL panel having a connecting electrode; and an electrical connecting unit laminated on the organic EL panel, wherein the electrical connecting unit has a flexible substrate and a capacitive sensing circuit provided on the flexible substrate and having a land, the electrical connecting unit is provided on a light-emitting surface side of the organic EL panel, the electrical connecting unit has a light-permeable part and a bent part formed by making two or more cuts in at least one side of the light-permeable part, and the land constituting the sensing circuit and the connecting electrode of the organic EL panel are electrically connected to each other at the bent part.

20 Claims, 6 Drawing Sheets

(51) Int. Cl.
*G06F 3/044* (2006.01)
*H01L 27/32* (2006.01)
*H01L 51/00* (2006.01)
*H01L 51/50* (2006.01)

(52) U.S. Cl.
CPC .......... *G06F 3/0416* (2013.01); *H01L 27/323* (2013.01); *H01L 51/0097* (2013.01); *H01L 51/5012* (2013.01); *H01L 51/5056* (2013.01); *H01L 51/5072* (2013.01); *H01L 51/5088* (2013.01); *H01L 51/5092* (2013.01); *G06F 2203/04102* (2013.01); *G06F 2203/04104* (2013.01); *H03K 2017/9634* (2013.01); *Y02E 10/549* (2013.01)

(58) Field of Classification Search
CPC . G06F 2203/04102; G06F 2203/04104; H01L 27/323; H01L 51/0097; H01L 51/5012; H01L 51/5056; H01L 51/5072; H01L 51/5088; H01L 51/5092
See application file for complete search history.

(56) References Cited

FOREIGN PATENT DOCUMENTS

| | | | |
|---|---|---|---|
| JP | 2012194291 A | 10/2012 | |
| JP | 2013065429 A | 4/2013 | |
| JP | 2014013266 A | 1/2014 | |
| JP | 2014021845 A | 2/2014 | |
| WO | 2013121667 A1 | 8/2013 | |

\* cited by examiner

ORGANIC ELECTROLUMINESCENCE MODULE AND SMART DEVICE

CROSS REFERENCE TO RELATED APPLICATION

This Application is a 371 of PCT/JP2015/055372 filed on Feb. 25, 2015 which, in turn, claimed the priority of Japanese Application No. 2014-037796 filed on Feb. 28, 2014, both applications are incorporated herein by reference.

TECHNICAL FIELD

The present invention relates to an organic electroluminescence module having a touch-sensing function and a smart device equipped with the same.

BACKGROUND ART

Examples of a conventional planar light source include: a light-emitting diode (hereinafter, abbreviated as LED) using a light guide plate; and an organic light-emitting diode (hereinafter, also referred to as organic electroluminescence element, organic EL element, or OLED).

Since around 2008, an LED light source using a light guide plate has rapidly come to be used not only for general lighting but also as, for example, a backlight for the main display (e.g., liquid crystal display: LCD) of a smart device (e.g., smartphone or tablet) that has become popular worldwide.

Such an LED light source is used not only as a backlight for main display but also as a backlight for common function key buttons provided in the lower part of a smart device.

There is a case where common function key buttons are provided with, for example, three kinds of marks representing "Home" (indicated by, for example, a square mark), "Return" (indicated by, for example, an arrow mark), and "Search" (indicated by, for example, a magnifying glass mark).

From the viewpoint of improving visibility, such common function key buttons are configured by previously forming dotted deflection patterns in a light guide plate according to the pattern shapes of the marks to be displayed and providing an LED light source on the lateral side of the light guide plate to emit light toward the side surface of the light guide plate. In such common function key buttons, light emitted from the LED light source enters from the side surface of the light guide plate, and is then totally reflected by the deflection reflecting surface of the deflection patterns toward the front surface of the light guide plate. As a result, light is emitted in predetermined patterns from the front side of the light guide plate, and therefore when the light guide plate is viewed from the front, the light patterns can be seen (see, for example, Patent Literature 1).

Further, for the purpose of improving the sensitivity of a sensor electrode of a capacitive information input unit using an LED light source to allow a sensor circuit to reliably detect a change in capacitance to stably process input operations by a user, a method is disclosed in which an adhesive layer having a higher permittivity than an air layer having the same shape is provided between a flexible printed circuit (hereinafter, abbreviated as FPC) having a sensor electrode formed thereon and a surface panel so as to be located in a position other than the position of an icon or the like to improve the detection accuracy of the sensor electrode that detects a capacitance (see, for example, Patent Literature 2).

On the other hand, there is also a move to use a surface-emitting organic electroluminescence panel (hereinafter, abbreviated as organic EL panel) to achieve lower power consumption and a more uniform luminance of emitted light. Such an organic EL panel is provided on the back side of a part of a cover glass where marks or the like are previously printed to display the marks or the like.

A smart device is absolutely required to have a tough function, and therefore a capacitive touch-sensing device for touch detection is usually provided on the back surface side of a cover glass in the display area and the common function key area of the smart device.

As such a touch-sensing device, a film/film-type touch sensor is often used which is obtained by laminating films enlarged to the same size as the cover glass. In the case of a smart device whose thickness is not particularly limited, a glass/glass-type touch-sensing device is sometimes used. As a touch-sensing system, a capacitive touch-sensing system is recently often used. For a main display, one of projected capacitive touch-sensing systems, called "mutual capacitive touch-sensing system", is used which has fine electrode patterns in both x- and y-axis directions. This system allows so-called "multi-touch" so that two or more touches can be detected.

Since such a touch sensor is used, a light-emitting device having no touch function has heretofore been used in a common function key area. However, with the recent advent of so-called "in-cell"- or "on-cell"-type displays, a light-emitting device for common function keys has strongly been required to have its own touch-sensing function.

On the other hand, a common function key area does not need to have the above-described multi-touch function, and therefore one of capacitive touch-sensing systems capable of detecting On/Off, called "self-capacitive touch-sensing system", can sufficiently fulfill functions required for common function keys. In the case of such a self-capacitive touch-sensing system, an electrode for touch detection has a simple pattern such as a solid pattern.

In the case of a surface-emitting organic EL panel, an anode, a cathode, or a protective metal foil layer constituting an organic EL element adversely affects the detection of a change in capacitance by the above-described capacitive touch-sensing system. For this reason, for example, an assembly needs to be provided on the light-emitting surface side of the organic EL element when a capacitive touch function is added to the organic EL panel. That is, such a significant restriction is placed on setting a touch function. Such a method in which an assembly is provided involves a need to additionally supply a touch device, and therefore has a problem of increase in economic burden.

In order to solve such a problem, a technique is known in which a capacitive sensing circuit is provided in an FPC used to mount an organic EL panel or an LED. However, in the case of an organic EL panel, an electrode plane constituting a capacitive sensing circuit is provided on the opposite side from the light-emitting surface of an organic EL element. As a result, an FPC is provided on the opposite side from the light-emitting surface. In this case, a structure illustrated in FIG. 8 that will be described later is obtained, but this structure has a problem that the touch-sensing accuracy of the FPC having the capacitive sensing circuit is very low.

On the other hand, in order to avoid the FPC from being provided on the back side of the organic EL panel, as illustrated in FIG. 9 that will be described later, the FPC may be provided outside the region of the organic EL panel. However, such a structure has a problem that an increase in the distance between the position where light is emitted and the position of the touch-sensing circuit or an increase in the total area of an organic EL module adversely affects the application of the organic EL module to a smart device required to have a small format.

Therefore, there has been a demand for development of an organic electroluminescence module (hereinafter, abbreviated as organic EL module) that is formed by compactly laminating an organic EL element as a light-emitting device and a wiring material to achieve a reduction in size and thickness, that has a high touch-sensing accuracy, and that is applicable to smart devices.

CITATION LIST

Patent Literature

Patent Literature 1: JP 2012-194291 A
Patent Literature 2: JP 2013-065429 A

SUMMARY OF INVENTION

Technical Problem

In view of the above problems and circumstances, it is an object of the present invention to provide an organic electroluminescence module that achieves a small format and a reduction in thickness, that has a high touch-sensing accuracy, and that is applicable to smart devices, and a smart device equipped with the same.

Solution to Problem

In order to achieve the above object, the present inventor has intensively studied, and as a result have found that an organic electroluminescence module that achieves a reduction in size and thickness, that has a high touch sensing accuracy, and that is applicable to smart devices can be provided by providing an organic electroluminescence module including: an organic electroluminescence panel having a connecting electrode; and an electrical connecting unit laminated on the organic electroluminescence panel, wherein the electrical connecting unit has a flexible substrate, a capacitive sensing circuit provided on the flexible substrate and having a land, and a wiring part provided on a back surface side of the flexible substrate, wherein the electrical connecting unit is provided on a light-emitting surface side of the organic electroluminescence panel, wherein the electrical connecting unit has a light-permeable part and a bent part formed by making two or more cuts in at least one side of the light permeable part, and wherein the land constituting the sensing circuit and the connection electrode of the organic electroluminescence panel are electrically connected to each other at the bent part.

More specifically, the object of the present invention is achieved by the following means.

1. An organic electroluminescence module including: an organic electroluminescence panel having a connecting electrode; and an electrical connecting unit laminated on the organic electroluminescence panel, wherein the electrical connecting unit has a flexible substrate, a capacitive sensing circuit provided on the flexible substrate and having a land, and a wiring part provided on a back surface side of the flexible substrate, the electrical connecting unit is provided on a light-emitting surface side of the organic electroluminescence panel, the electrical connecting unit has a light-permeable part and a bent part formed by making two or more cuts in at least one side of the light-permeable part, and the land constituting the sensing circuit and the connecting electrode of the organic electroluminescence panel are electrically connected to each other at the bent part.

2. The organic electroluminescence module according to the above 1, wherein the bent part is formed on a side opposite to a light-emitting surface of the organic electroluminescence panel.

3. The organic electroluminescence module according to the above 1 or 2, wherein the electrical connecting unit has a light-permeable opening in a region overlapping with at least the organic electroluminescence panel.

4. The organic electroluminescence module according to the above 3, wherein the capacitive sensing circuit constituting the electrical connecting unit is provided along a periphery of the light-permeable opening, on a pair of opposite sides of the light-permeable opening, or on at least one side of the light-permeable opening.

5. The organic electroluminescence module according to anyone of the above 1 to 4, wherein the electrical connecting unit is provided on the light-emitting surface side of the organic electroluminescence panel and in a region overlapping with the organic electroluminescence panel.

6. The organic electroluminescence module according to any one of the above 1 to 5, wherein the organic electroluminescence panel includes an organic electroluminescence element, and the organic electroluminescence element has a pair of planar electrodes opposed to each other.

7. The organic electroluminescence module according to any one of the above 1 to 6, wherein a member electrically connecting together the land constituting the sensing circuit and the connecting electrode of the organic electroluminescence panel is an anisotropic conductive film, a conductive paste, or a metal paste.

8. The organic electroluminescence module according to any one of the above 1 to 7, wherein the two or more organic electroluminescence panels are arranged in parallel.

9. A smart device including the organic electroluminescence module according to any one of the above 1 to 8.

Advantageous Effects of Invention

According to the present invention, it is possible to provide an organic electroluminescence module that achieves a reduction in size and thickness, that has a high touch-sensing accuracy, and that is applicable to smart devices, and a smart device equipped with the same.

The technical features of the organic EL module according to the present invention and mechanisms for producing the effects thereof are as follows.

The structural feature of the organic EL module according to the present invention is that an electrical connecting unit having a flexible substrate, a capacitive sensing circuit provided on the flexible substrate, and a wiring part provided on a back surface side of the flexible substrate is provided on a light-emitting side of an organic EL panel, the electrical connecting unit has an opening in a region where the organic EL panel is provided and has a bent part formed by making two or more cuts in at least one side of the opening, and the bent part is bent toward a back surface (lower) side of the organic EL panel to electrically connect together a land constituting the sensing circuit at the bent part and a connecting electrode located on the back side of the organic EL panel. Therefore, the capacitive touch-sensing circuit can be provided between a glass substrate for touch panel and the organic EL panel without increasing the area of the organic EL module, which makes it possible to significantly improve a touch-sensing accuracy.

DESCRIPTION OF EMBODIMENTS

Figure 1A:
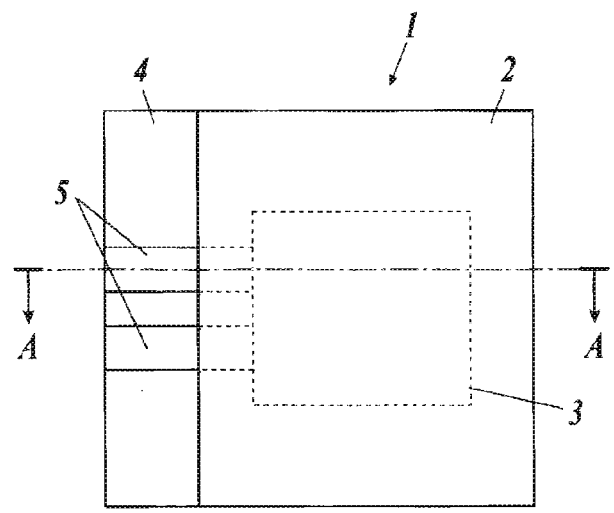
FIG. 1A is a schematic bottom view illustrating one example of the structure of an organic EL panel constituting an organic EL module.

An organic EL module according to the present invention includes: an organic EL panel having a connecting electrode; and an electrical connecting unit laminated on the organic EL panel, wherein the electrical connecting unit has a flexible substrate, a capacitive sensing circuit provided on the flexible substrate and having a land, and a wiring part provided on a back surface side of the flexible substrate, the electrical connecting unit is provided on a light-emitting surface side of the organic EL panel, the electrical connecting unit has a light-permeable part and a bent part formed by making two or more cuts in at least one side of the light-permeable part, and the land constituting the sensing circuit and the connecting electrode of the organic EL panel are electrically connected to each other at the bent part. This is a technical feature common to the inventions of claims 1 to 9.

From the viewpoint of enhancing the effects of the present invention, the bent part is particularly preferably formed on a side opposite to a light-emitting surface of the organic EL panel, which makes it possible to achieve a smaller thickness and a higher touch-sensing accuracy.

From the viewpoint of achieving a small format, the electrical connecting unit preferably has a light-permeable opening in a region overlapping with the organic EL panel.

In the organic EL module according to the present invention, the capacitive sensing circuit constituting the electrical connecting unit may be provided along the periphery of the light-permeable opening, on a pair of opposite sides of the light-permeable opening, or on at least one side of the light-permeable opening depending on the specifications of a smart device to which the organic EL module is applied.

From the viewpoint of achieving a high touch-sensing accuracy and a small format, the electrical connecting unit is preferably provided on the light-emitting surface side of the organic EL panel and in a region overlapping with the organic EL panel.

An organic EL element constituting the organic EL panel preferably has a pair of planar electrodes opposed to each other.

From the viewpoint that the connecting electrode of the organic EL panel and the land constituting the sensing circuit can be easily and reliably connected to each other, a member electrically connecting together the land and the connecting electrode is preferably an anisotropic conductive film, a conductive paste, or a metal paste.

From the viewpoint of responding to the functional diversification of a smart device, the two or more organic EL panels are preferably arranged in parallel.

Hereinbelow, the present invention, components thereof, and embodiments for carrying out the present invention will be described in detail. It is to be noted that in this specification, to between numerical values is used to express a range including the values described before and after to as a lower limit value and an upper limit value, respectively.

<<Organic EL Module>>

The organic EL module according to the present invention includes: at least an organic EL panel having a connecting electrode; and an electrical connecting unit laminated on the organic EL panel, wherein (1) the electrical connecting unit has a flexible substrate, a capacitive sensing circuit provided on the flexible substrate and having a land, and a wiring part provided on a back surface side of the flexible substrate, wherein (2) the electrical connecting unit is provided on a light-emitting surface side of the organic EL panel, wherein (3) the electrical connecting unit has a light-permeable part and a bent part formed by making two or more cuts in at least one side of the light-permeable part, and wherein (4) the land constituting the sensing circuit and the connecting electrode of the organic EL panel are electrically connected to each other at the bent part.

Before the description of the entire structure of the organic EL module, the structure of the organic EL panel constituting the organic EL module and the structure of the electrical connecting unit will be first described in detail with reference to the accompanying drawings. It is to be noted that in the following description, a numeral within parentheses described after each component represents the reference sign of the component illustrated in the drawings.

[Structure of Organic EL Panel]

Figure 1B:
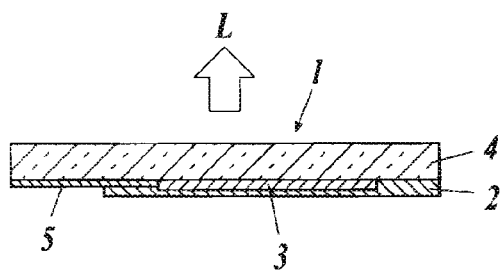
FIG. 1B is a schematic sectional view illustrating one example of the structure of the organic EL panel constituting the organic EL module.
Figure 2:
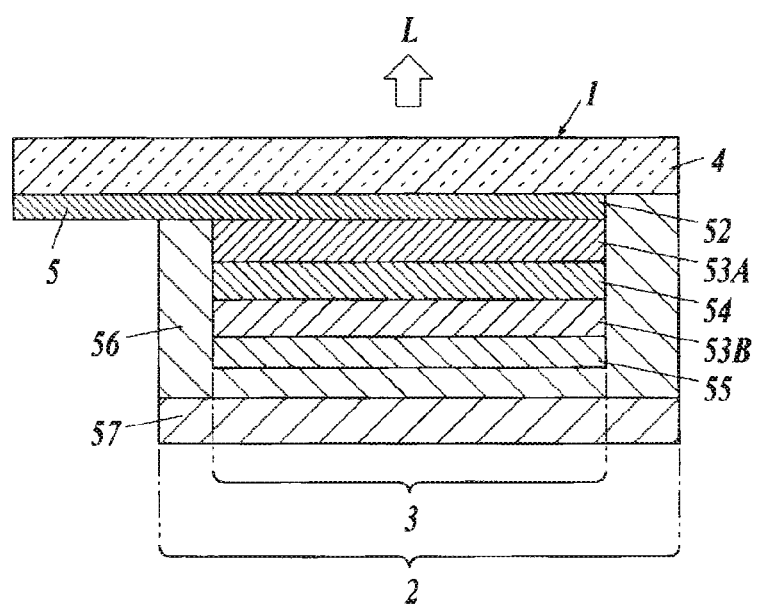
FIG. 2 is a schematic sectional view illustrating one example of the structure of an organic EL element constituting the organic EL panel.

FIG. 1A is a schematic bottom view illustrating one example of the structure of the organic EL panel constituting the organic EL module, FIG. 1B is a schematic sectional view illustrating one example of the detailed structure of the organic EL panel constituting the organic EL module, and FIG. 2 is a schematic sectional view illustrating one example of the structure of the organic EL element constituting the organic EL module.

FIG. 1A is a schematic view of an organic EL panel (1) viewed from the bottom surface side thereof. The organic EL panel (1) includes a transparent base material (4), a light-emitting region (3) of an organic EL element provided on the transparent base material (4), and a sealing structure (2) composed of a sealing member and provided along the periphery of the light-emitting region (3). Further, connecting electrodes (5) are extracted from the end of the light-emitting region (3) of the organic EL element, and the connecting electrodes (5) are connected to lands constituting a sensing circuit of an electrical connecting unit that will be described later via an electrically-connecting member so as to be connected to an external drive circuit.

FIG. 1B is a schematic sectional view of the organic EL panel (1) cut along a line A-A in FIG. 1A, wherein the upper side of the plane of paper corresponds to a light-emitting surface (L) side. As illustrated in FIG. 1B, the light-emitting region (3) of the organic EL element is provided on the transparent base material (4) and sealed with the sealing structure (2) provided along the periphery thereof, and a cathode or an anode is extracted from the end of the light-emitting region (3) of the organic EL element to form the connecting electrodes (5) at the end of the transparent base material (4).

As illustrated in FIG. 2 that is a schematic sectional view of the organic EL element constituting the organic EL panel (1), the light-emitting region (3) is formed by laminating, on the transparent base material (4), an anode (52), an organic functional layer group 1 (53A, composed of, for example, a hole injection layer and/or a hole transport layer), a light-emitting layer (54), an organic functional layer group 2 (53B, composed of, for example, an electron transport layer and/or an electron injection layer), and a cathode (55) from the upper side of the plane of paper so that these layers are located under the transparent base material (4). The anode (52) extends to the end of the transparent base material (4) to form the connecting electrodes (5). The outer periphery of the light-emitting region (3) is sealed with a sealing adhesive (56), and the surface of the light-emitting region (3) is covered with a sealing member (57) to prevent the penetration of a harmful gas (e.g., oxygen, moisture) from the external environment into the light-emitting region (3). In FIG. 2, the upper side of the plane of paper corresponds to a light-emitting surface (L) side, and therefore the transparent base material (4), the anode (52), and the organic functional layer group 1 (53A) located on the front surface side of the light-emitting layer (54) are preferably made of a material having a high light permeability.

It is to be noted that the concrete components of the organic EL panel and a method for producing the organic EL panel will be described later in detail.

[Electrical Connecting Unit]

The electrical connecting unit according to the present invention is also referred to as FPC (flexible printed circuit), and mainly includes a flexible substrate, a capacitive sensing circuit provided on one of the surfaces of the flexible substrate, and a wiring part provided on the other surface of the flexible substrate.

Further, the structural feature of the electrical connecting unit (FPC) is that the electrical connecting unit has a light-permeable part and a bent part formed by making two or more cuts in at least one side of the light-permeable part.

In addition, the electrical connecting unit preferably has a light-permeable opening in a region overlapping with at least the organic EL panel.

Figure 3A:
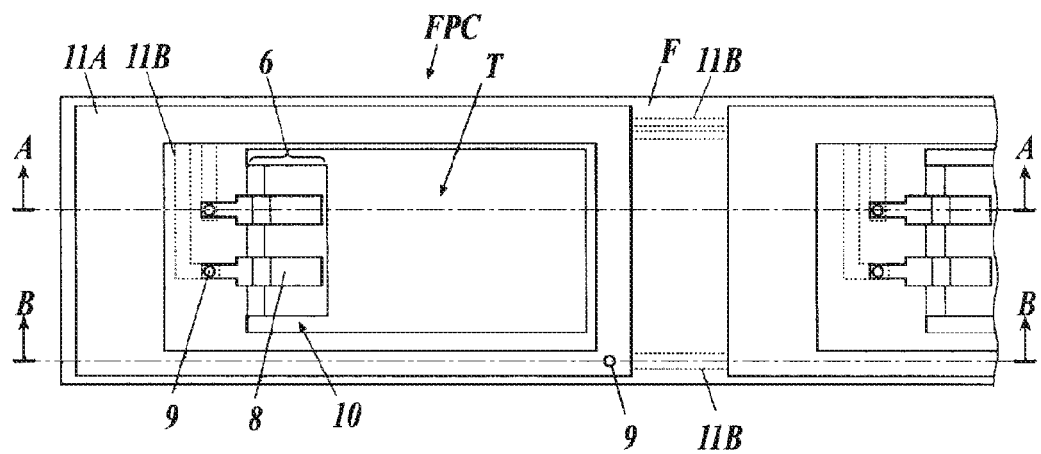
FIG. 3A is a schematic top view illustrating one example of the structure of an electrical connecting unit (FPC: flexible printed circuit).
Figure 3B:
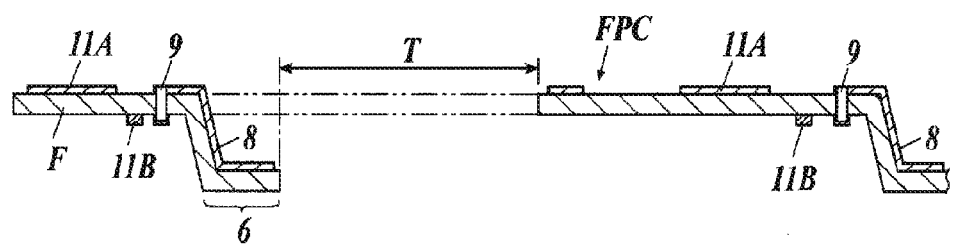
FIG. 3B is a schematic sectional view illustrating one example of the structure of the electrical connecting unit (FPC: flexible printed circuit) cut along a line A-A.
Figure 3C:
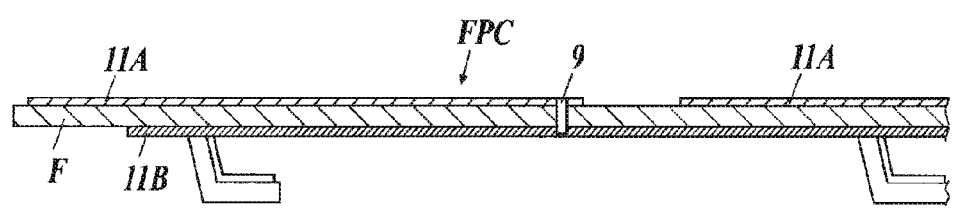
FIG. 3C is a schematic sectional view illustrating one example of the structure of the electrical connecting unit (FPC: flexible printed circuit) cut along a line B-B.

FIG. 3A is a schematic top view illustrating one example of the structure of the electrical connecting unit (FPC: flexible printed circuit), and FIGS. 3B and 3C are schematic sectional views each illustrating one example of the structure of the electrical connecting unit (FPC).

In the electrical connecting unit (FPC) illustrated in FIG. 3A, a hollow square-shaped capacitive sensing circuit (11A) having an opening in the center thereof is provided on the front surface side of a flexible substrate (F). Touch detection is performed by the sensing circuit (11A). Further, a back-side wiring part (11B) is provided on the back surface side of the flexible substrate (F) to make a connection to a drive IC. The back-side wiring part (11B) is indicated by a broken line.

The electrical connecting unit (FPC) has a light-permeable part (T, also referred to as opening) formed in a region where the organic EL panel is to be provided. Two cuts (10) are made at upper and lower positions in one side (left side in FIG. 3A) of the opening (T) to form a flap (6). On the front surface of the flap (6), lands (8) are provided to be connected to the connecting electrodes of the organic EL panel via the electrically-connecting member.

FIG. 3B is a sectional view of the electrical connecting unit (FPC) cut along a line A-A in FIG. 3A. As illustrated in FIG. 3B, the capacitive sensing circuit (11A) for touch detection is provided on the top surface side of the flexible substrate (F). Further, the opening (T) is provided, the flap (6) is formed at the left end of the opening (T), and the lands (8) are provided on the front surface side of the flap (6). On the back surface side of the flexible substrate (F), the back-side wiring part (11B) is provided to make a connection to the drive IC. The lands (8) formed on the flap (6) and the back-side wiring part (11B) are electrically connected to each other via through holes (9).

Figure 5A:
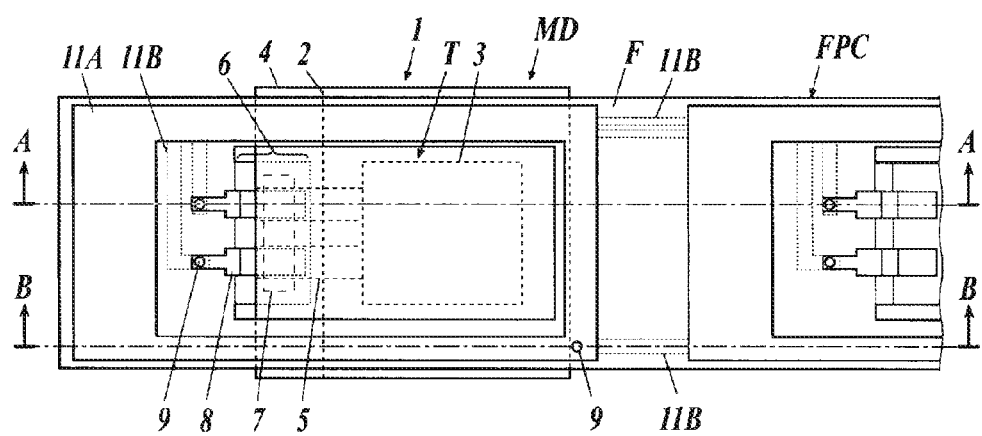
FIG. 5A is a schematic top view illustrating one example of the structure of an organic EL module according to the present invention.
Figure 5B:
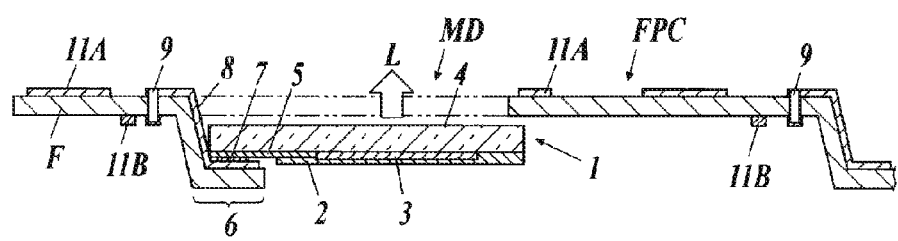
FIG. 5B is a schematic sectional view illustrating one example of the structure of the organic EL module according to the present invention cut along a line A-A.
Figure 5C:
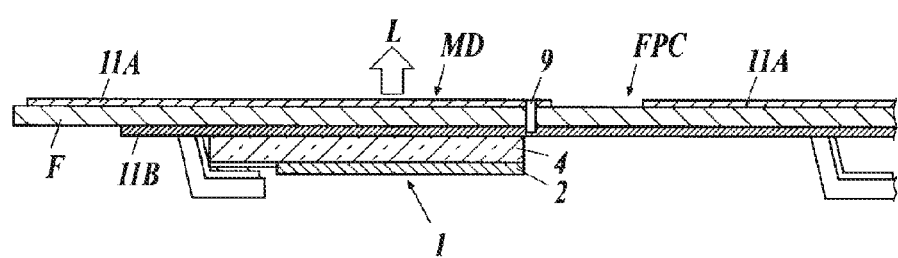
FIG. 5C is a schematic sectional view illustrating one example of the structure of the organic EL module according to the present invention cut along a line B-B.

In the present invention, the downwardly-bent flap (6) is provided in part of the opening (T) of the electrical connecting unit (FPC), which makes it possible to provide the electrical connecting unit (FPC) on the top surface side of the organic EL panel as illustrated in FIGS. 5A to 5C that will be described later and therefore to significantly improve touch-sensing accuracy.

Further, the structure illustrated in FIGS. 3A and 3B allows the sensing circuit (11A) to be located close to the light-emitting region (3) of the organic EL element in a region overlapping with the sealing structure (2) of the organic EL panel (1) as illustrated in FIGS. 5A to 5C that will be described later. This makes it possible to reduce the size of the electrical connecting unit (FPC) and therefore to achieve a small-format display system.

The flexible substrate (F) constituting the electrical connecting unit (FPC) is not particularly limited as long as the flexible substrate is made of a transparent and flexible plastic material having a sufficient mechanical strength. Examples of such a plastic material include polyimide (PI) resins, polycarbonate resins, polyethylene terephthalate (PET) resins, polyethylene naphthalate (PEN) resins, and cycloolefin (COP) resins, and polyimide (PI) resins, polyethylene terephthalate (PET) resins, and polyethylene naphthalate (PEN) resins are preferred.

The sensing circuit (11A) and the back-side wiring part (11B) are preferably made of a conductive metal material such as gold, silver, copper, or ITO, but is preferably made of copper in the present invention.

FIG. 3C is a sectional view of the electrical connecting unit (FPC) cut along a line B-B in FIG. 3A. As illustrated in FIG. 3C, the capacitive sensing circuit (11A) for touch detection is provided on the top surface side of the flexible substrate (F), the back-side wiring part (11B) is provided on the back surface side of the flexible substrate (F), and the sensing circuit (11A) and the back-side wiring part (11B) are electrically connected via the through holes (9).

(Method for Producing Electrical Connecting Unit (FPC))

Hereinbelow, one example of a method for producing the electrical connecting unit (FPC) will be described.

The electrical connecting unit (FPC) is formed using a double-sided copper clad board having a polyimide (PI) resin film as the flexible substrate (F). Such a double-sided copper clad board is, for example, a 38 μm-thick polyimide (PI) film having a 12 μm-thick first copper layer (corresponding to 11A) and a 12 μm-thick second copper layer (corresponding to 11B) on both surfaces, respectively. If necessary, a cover layer is provided on each of the copper layers to protect the surface of the copper layer. The cover layer is, for example, a transparent polyethylene terephthalate film, and the film is attached to the surface of each of the copper layers via an adhesive layer by heat lamination or the like.

Hereinbelow, a method for forming such a conductive circuit pattern as illustrated in FIGS. 3A to 3C in each of the copper layers will be described.

A photoresist material is applied or dry resist films are laminated on the copper layers provided on both surfaces of the PI film. Then, each of the copper layers is subjected to exposure using a mask or the like to obtain a desired wiring pattern and then subjected to development. Then, the unnecessary resist is removed to form a resist pattern.

Then, the copper layers each having the resist pattern are subjected to etching by immersing in an etchant or showering an etchant to form desired copper wiring patterns on both surfaces of the film.

Then, through holes for electrically connecting together the wiring patterns formed on the front and back surfaces are formed. First, drilled holes are formed at positions where through holes are to be provided, and the inner surfaces of the drilled holes are given copper plating to electrically connect the first copper layer (corresponding to 11A) and the second copper layer (corresponding to 11B) at desired positions.

Finally, an opening (T), cuts (10), and a flap (6) are formed by making holes at desired positions using a pinnacle die or the like.

(Sizes of Parts of Electrical Connecting Unit (FPC))

The sizes of the parts of the electrical connecting unit (FPC) according to the present invention are appropriately set according to the size of a device, such as a smart device, to which the electrical connecting unit (FPC) is applied. However, the typical sizes of the parts constituting the electrical connecting unit will be described with reference to FIG. 4.

Figure 4:
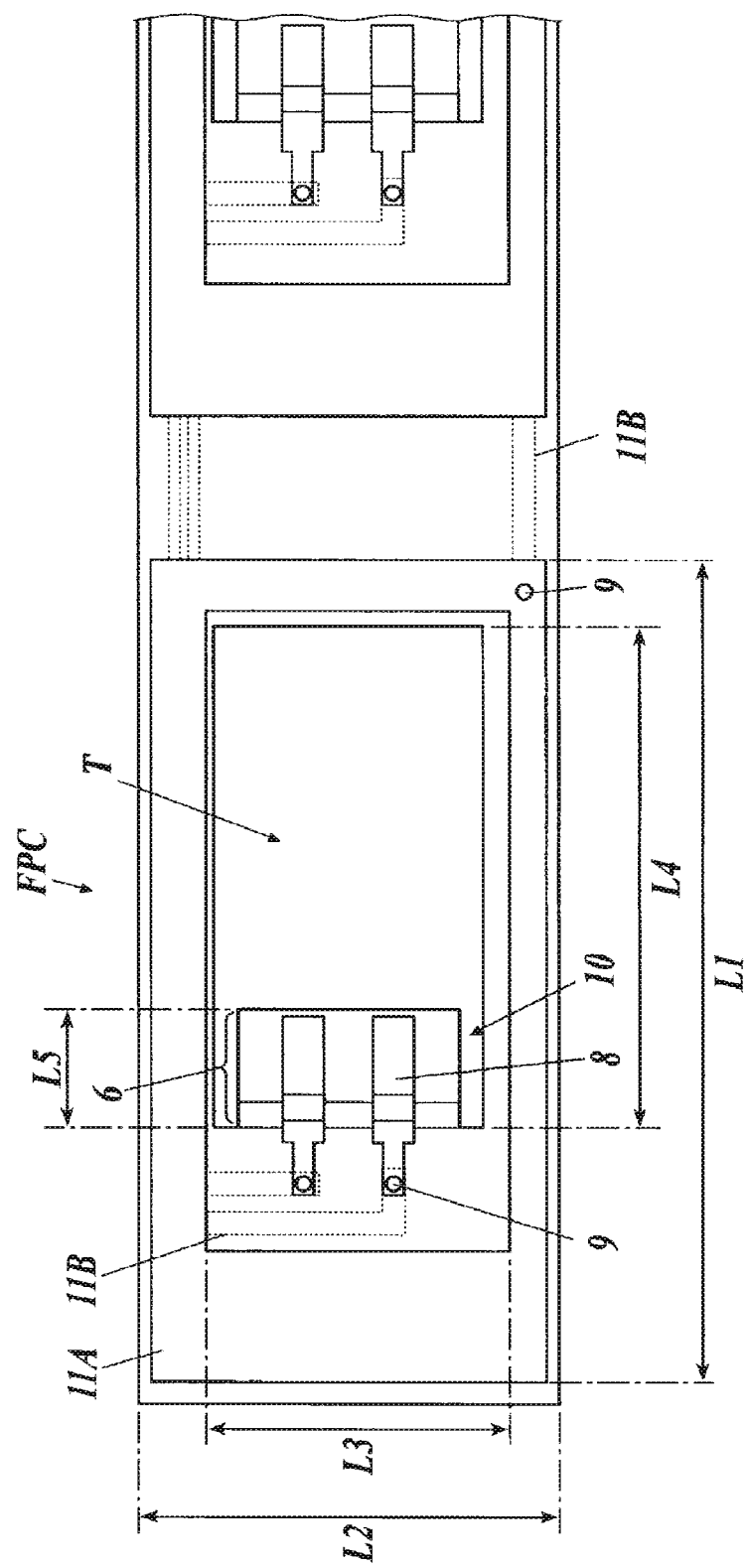
FIG. 4 is a schematic top view used to explain the sizes of components of the electrical connecting unit.

FIG. 4 is a schematic top view used to explain the sizes of the parts constituting the electrical connecting unit (FPC).

In FIG. 4, L1 corresponding to the length of one unit (one pixel) of the organic EL module (MD) is in the range of about 10 to 40 mm, preferably in the range of 15 to 25 mm. The vertical width L2 of the organic EL module (MD) is in the range of about 3 to 15 mm, preferably in the range of 5 to 10 mm. The length of the inner short side L3 of the hollow square-shaped capacitive sensing circuit (11A) formed on the front surface side of the flexible substrate is in the range of about 2 to 10 mm, preferably in the range of 3 to 8 mm. The length of the long side L4 is in the range of about 8 to 25 mm, preferably in the range of 10 to 20 mm. The length L5 of the bent part (6) is in the range of 1 to 8 mm, preferably in the range of 2 to 6 mm.

[Production of Organic EL Module]

Hereinbelow, a method for producing the organic EL module (MD) using the organic EL panel (1) and the electrical connecting unit (FPC) will be described.

The organic EL module (MD) according to the present invention is configured by combining the above-described organic EL panel (1) and electrical connecting unit (FPC). The electrical connecting unit (FPC) is provided on the light-emitting surface (L) side of the organic EL panel (1) according to the present invention, and the lands (8) constituting the sensing circuit of the electrical connecting unit (FPC) and the connecting electrodes (5) of the organic EL panel (1) are electrically connected to each other at the flap (6) of the electrical connecting unit (FPC).

FIGS. 5A to 5C are a schematic top view and schematic sectional views illustrating one example of the structure of the organic EL module (MD) according to the present invention.

As illustrated in FIG. 5A, the organic EL module (MD) is configured by providing, on the light-emitting surface side, that is, on the top surface side of the organic EL panel (1), the electrical connecting unit (FPC) having the flexible substrate (F), the capacitive sensing circuit (11A) provided on the flexible substrate (F), and the wiring part (11B) provided on the back surface side of the flexible substrate (F).

In the opening (T) of the electrical connecting unit (FPC), the flap (6) is provided. On the upper surface of the flap (6), the lands (8) are provided to be connected to the connecting electrodes (5) of the organic EL panel (1). The lands (8) are connected via the through holes (9) to the back-side wiring part (11B) provided on the back surface side of the electrical connecting unit (FPC) to make a connection to the drive IC (not illustrated).

The organic EL panel (1) and the electrical connecting unit (FPC) are electrically connected to each other in such a manner as illustrated in FIG. 5B.

FIG. 5B is a sectional view of the organic EL module (MD) cut along a line A-A in FIG. 5A.

The electrical connecting unit (FPC) having the flap (6) in the opening is provided on the light-emitting surface (L) side so that the organic EL panel (1) having the connecting electrodes (5) on the lower surface side thereof is interposed between the electrical connecting unit (FPC) and the flap (6). In this regard, the sensing circuit (11A) of the electrical connecting unit (FPC) is preferably formed to be located close to the light-emitting region (3) of the organic EL element in a region overlapping with at least the sealing structure (2) of the organic EL panel (1).

As illustrated in FIG. 5B, the lands (8) formed on the flap (6) of the electrical connecting unit (FPC) and the connecting electrodes (5) of the organic EL panel (1) are connected to each other by the electrical connecting member (7).

The electrical connecting member (7) is not particularly limited as long as the electrical connecting member is a conductive member, but is preferably an anisotropic conductive film (ACF), a conductive paste, or a metal paste.

The anisotropic conductive film (ACF) is, for example, a layer made of a mixture of a thermosetting resin and fine conductive particles. The conductive particle-containing layer that can be used in the present invention is not particularly limited as long as conductive particles are contained as an anisotropic conductive member, and can be appropriately selected according to the intended use. The conductive particles that can be used as the anisotropic conductive member according to the present invention can be appropriately selected according to the intended use, and examples thereof include metal particles and metal-coated resin particles. Examples of a commercially available ACF include cold-setting ACFs, such as MF-331 (manufactured by Hitachi Chemical Company, Ltd), that can be applicable also to resin films.

Examples of the metal particles include nickel, cobalt, silver, copper, gold, and palladium particles. They may be used singly or in combination of two or more of them. Among them, nickel, silver, and copper particles are preferred. In order to prevent surface oxidation, these particles may be surface-coated with gold or palladium. These particles may be provided with surface metal projections or may be surface-coated with an organic insulating film.

Examples of the metal-coated resin particles include particles obtained by coating the surface of resin cores with any one of metals including nickel, copper, gold, and palladium. The metal-coated resin particles may be particles obtained by coating the outermost surface of resin cores with gold or palladium. The metal-coated resin particles may be particles obtained by providing metal projections on the surface of resin cores or particles obtained by coating the surface of resin cores with an organic insulating film.

The metal paste may be a commercially-available metal nanoparticle paste appropriately selected from, for example, a silver particle paste, a silver-palladium particle paste, a gold particle paste, and a copper particle paste. Examples of the metal paste include silver pastes for organic EL element substrates (e.g., CA-6178, CA-6178B, CA-2500E, CA-2503-4, CA-2503N, and CA-271, specific resistance: 15 to 30 mΩ·cm, screen printing, curing temperature: 120 to 200° C.), pastes for LTCC (PA-88 (Ag), TCR-880 (Ag), and PA-Pt (Ag.Pt)), and silver pastes for glass substrates (US-201 and UA-302, firing temperature: 430 to 480° C.) which are available from DAIKEN CHEMICAL CO., LTD.).

FIG. 5C is a sectional view of the organic EL module (MD) cut along a line B-B in FIG. 5A.

Hereinbelow, the shape of the capacitive sensing circuit (11A) of the electrical connecting unit (FPC) that is the component of the organic EL module (MD) according to the present invention will be described.

Figure 6A:
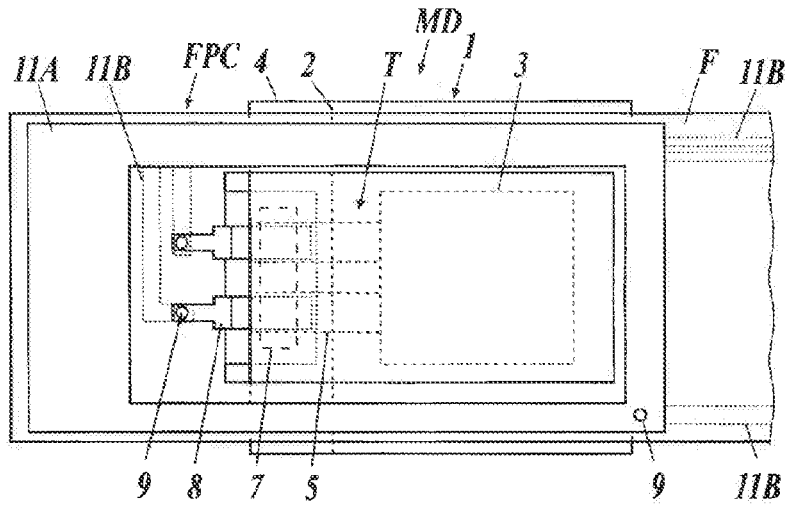
FIG. 6A is a schematic top view illustrating one example of the shape of a capacitive sensing circuit of the electrical connecting unit.
Figure 6B:
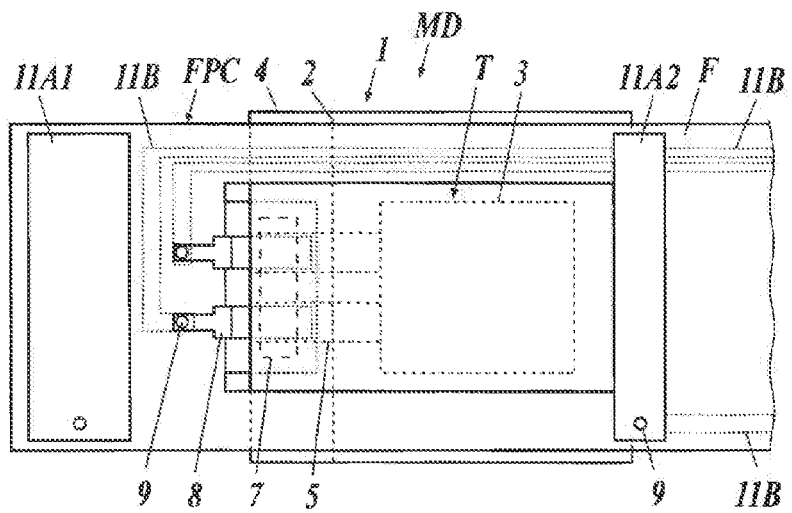
FIG. 6B is a schematic top view illustrating another example of the shape of the capacitive sensing circuit of the electrical connecting unit.
Figure 6C:
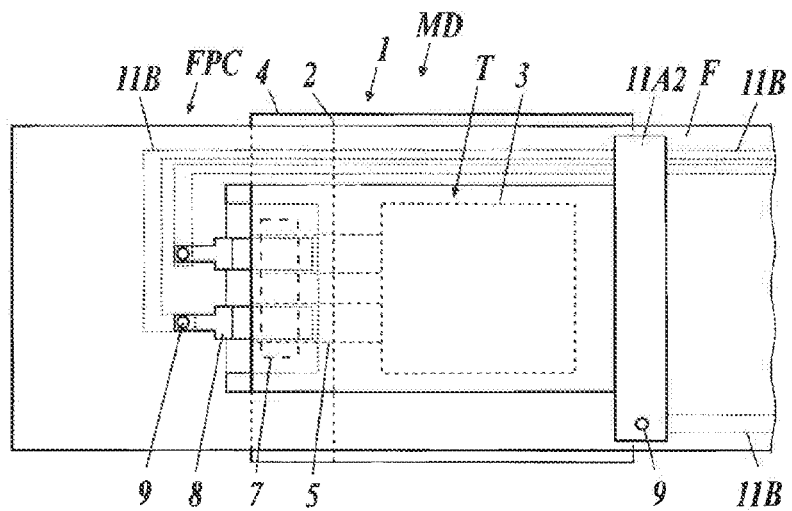
FIG. 6C is a schematic top view illustrating another example of the shape of the capacitive sensing circuit of the electrical connecting unit.

FIGS. 6A to 6C are schematic top views illustrating various shapes of the capacitive sensing circuit (11A) of the electrical connecting unit (FPC).

FIG. 6A illustrates the typical capacitive sensing circuit (11A) illustrated also in FIGS. 3A to 3C, FIG. 4, and FIGS. 5A to 5C, which is continuously formed in a hollow square shape to have the opening (T). FIG. 6B illustrates a case where sensing circuits (11A1 and 11A2) are independently formed on the opposite right and left sides of the flexible substrate (F). FIG. 6C illustrates a case where a sensing circuit (11A2) is formed on one side of the opening so as to cover the organic EL panel. These sensing circuits (11A, 11A1, and 11A2) may have any shape selected according to the purpose or use of a touch-sensing function.

<<Structure of Organic EL Element and Method for Producing Organic EL Element>>

In the organic EL element constituting the organic EL panel, as illustrated in FIG. 2, the light-emitting region (3) is formed by, for example, laminating, on the transparent base material (4), the anode (52), the organic functional layer group 1 (53A, composed of, for example, a hole injection layer and/or a hole transport layer), the light-emitting layer (54), the organic functional layer group 2 (53B, composed of, for example, an electron transport layer and/or an electron injection layer), and the cathode (55) from the upper side of the plane of paper so that these layers are located under the transparent base material (4). The connecting electrodes (5) are provided at the end of the anode (52), and the organic EL element is connected to the electrical connecting unit (FPC) via the connecting electrodes (5).

Typical examples of the structure of the organic EL element are shown below:

(i) anode/hole injection-transport layer/light-emitting layer/electron injection-transport layer/cathode (ii) anode/hole injection-transport layer/light-emitting layer/hole blocking layer/electron injection-transport layer/cathode (iii) anode/hole injection-transport layer/electron blocking layer/light-emitting layer/hole blocking layer/electron injection-transport layer/cathode (iv) anode/hole injection layer/hole transport layer/light-emitting layer/electron transport layer/electron injection layer/cathode (v) anode/hole injection layer/hole transport layer/light-emitting layer/hole blocking layer/electron transport layer/electron injection layer/cathode (vi) anode/hole injection layer/hole transport layer/electron blocking layer/light-emitting layer/hole blocking layer/electron transport layer/electron injection layer/cathode.

Further, a non-light-emitting intermediate layer may be provided between light-emitting layers. The intermediate layer may be a charge generating layer or a multiphoton unit structure.

As for the summary of the organic EL element applicable to the present invention, refer to structures described in, for example, JP 2013-157634A, JP 2013-168552A, JP 2013-177361 A, JP 2013-187211 A, JP 2013-191644 A, JP 2013-191804 A, JP 2013-225678 A, JP 2013-235994 A, JP 2013-243234 A, JP 2013-243236 A, JP 2013-242366 A, JP 2013-243371 A, JP 2013-245179 A, JP 2014-003249 A, JP 2014-003299 A, JP 2014-013910 A, JP 2014-017493 A, and JP 2014-017494 A.

Further, each of the layers constituting the organic EL element will be described.

[Transparent Base Material]

The transparent substrate (4) applicable to the organic EL element according to the present invention may be made of a transparent material such as glass or a plastic. Preferred examples of the transparent substrate (4) include glass, quartz, and a resin film.

Examples of the glass material include silica glass, soda-lime silica glass, lead glass, borosilicate glass, and alkali-free glass. From the viewpoint of adhesion to an adjacent layer, durability, and smoothness, the surface of such a glass material may be subjected to physical treatment such as polishing, or may be covered with an inorganic or organic coating film, or may be covered with a hybrid coating film composed of such coating films, if necessary.

Examples of the constituent material of the resin film include: polyesters such as polyethylene terephthalate (PET)

and polyethylene naphthalate (PEN); polyethylene; polypropylene; cellophane; cellulose esters and derivatives thereof such as cellulose diacetate, cellulose triacetate (TAC), cellulose acetate butyrate, cellulose acetate propionate (CAP), cellulose acetate phthalate, and cellulose nitrate; polyvinylidene chloride; poly(vinyl alcohol); poly(ethylene vinyl alcohol); syndiotactic polystyrene; polycarbonate; norbornene resin; polymethylpentene; polyether ketone; polyimide; polyether sulfone (PES); polyphenylene sulfide, polysulfones; polyetherimide; polyether ketone imide; polyamide; fluoropolymer; nylon; polymethyl methacrylate; acrylics and polyarylates; and cycloolefin-based resins such as ARTON (trade name, manufactured by JSR Corporation) and APEL (trade name, manufactured by Mitsui Chemicals, Inc.).

In the organic EL element, a gas barrier layer may be provided on the above-described transparent substrate (4), if necessary.

The gas barrier layer may be made of any material having the function of preventing the entry of the cause of deterioration of the organic EL element, such as moisture or oxygen. Examples of such a material include inorganic substances such as silicon oxide, silicon dioxide, and silicon nitride. Further, in order to improve the brittleness of the gas barrier layer, the gas barrier layer more preferably has a laminate structure composed of such an inorganic layer and an organic layer made of an organic material. The inorganic layer and the organic layer may be laminated in any order, but are preferably laminated alternately two or more times.

(Anode)

The anode constituting the organic EL element may be made of a metal such as Ag or Au, an alloy mainly containing a metal, CuI, or a metal oxide such as an indium-tin composite oxide (ITO), $SnO_2$, or ZnO, but is preferably made of a metal or an alloy mainly containing a metal, more preferably silver or an alloy mainly containing silver.

When the transparent anode is mainly made of silver, the purity of silver is preferably 99% or higher. Further, palladium (Pd), copper (Cu), gold (Au), and the like may be added to ensure the stability of silver.

The transparent anode is a layer mainly made of silver. More specifically, the transparent anode may be made of silver alone or an alloy containing silver (Ag). Examples of such an alloy include silver.magnesium (Ag.Mg), silver.copper (Ag.Cu), silver.palladium (Ag.Pd), silver.palladium.copper (Ag.Pd.Cu), and silver.indium (Ag.In).

Among these materials constituting the anode, anode constituting the organic EL element according to the present invention is preferably a transparent anode mainly made of silver and having a thickness in the range of 2 to 20 nm. The thickness is more preferably in the range of 4 to 12 nm. When the thickness is 20 nm or less, the transparent anode absorbs and reflects less components of light, which is preferred in that a high light transmission rate is maintained.

In the present invention, the layer mainly made of silver means that the silver content of the transparent anode is 60 mass % or higher, preferably 80 mass % or higher, more preferably 90 mass % or higher, particularly preferably 98 mass % or higher. The term "transparent" used in the term "transparent anode" means that the light transmission rate of the transparent anode according to the present invention at a wavelength of 550 nm is 50% or higher.

If necessary, the transparent anode may have a structure in which two or more layers mainly made of silver are laminated.

In the present invention, when the anode is a transparent anode mainly made of silver, a foundation layer is preferably provided under the anode from the viewpoint of promoting the uniformity of a silver film formed as the transparent anode. The foundation layer is not particularly limited, but is preferably a layer containing an organic compound having a nitrogen atom or a sulfur atom. The transparent anode is preferably formed on such a foundation layer.

[Intermediate Electrode]

The organic EL element according to the present invention may have, between the anode and the cathode, a structure in which two or more organic functional layer units composed of an organic functional layer group and a light-emitting layer are laminated so that the two or more organic functional layer units are separated from each other by an intermediate electrode layer unit having an independent connecting terminal intended to make an electrical connection.

[Light-Emitting Layer]

The light-emitting layer constituting the organic EL element preferably contains a phosphorescent compound as a light-emitting material.

The light-emitting layer is a layer that emits light by recombination of electrons injected from the electrode or the electron transport layer and holes injected from the hole transport layer, and a light-emitting portion may be inside the light-emitting layer or may be the interface between the light-emitting layer and its adjacent layer.

Such a light-emitting layer may have any structure as long as the light-emitting material contained in the light-emitting layer satisfies requirements for light emission. The light-emitting layer may have two or more layers having the same emission spectrum or maximum emission wavelength. In this case, a non-light-emitting intermediate layer is preferably provided between the light-emitting layers.

The total thickness of the light-emitting layer is preferably in the range of 1 to 100 nm, more preferably in the range of 1 to 30 nm to achieve a lower driving voltage. It is to be noted that when a non-light-emitting intermediate layer is provided between light-emitting layers, the total thickness of the light-emitting layer includes also the thickness of the intermediate layer.

The light-emitting layer can be formed using a light-emitting material or a host compound that will be described later by a conventional method such as vacuum deposition, spin coating, casting, LB (Langmuir Blodgett) method, or ink-jetting.

The light-emitting layer may contain a mixture of two or more light-emitting materials, or a mixture of a phosphorescent material and a fluorescent material (also referred to as fluorescent dopant or fluorescent compound) may be used in the same light-emitting layer. The light-emitting layer preferably contains a host compound (also referred to as light-emitting host) and a light-emitting material (also referred to as light-emitting dopant compound) so that the light-emitting material emits light.

<Host Compound>

The host compound contained in the light-emitting layer is preferably a compound whose phosphorescence quantum yield for phosphorescence emission at room temperature (25° C.) is less than 0.1. The phosphorescence quantum yield is preferably less than 0.01. Further, the volume ratio of the host compound to all the compounds contained in the light-emitting layer is preferably 50% or higher.

The host compound may be a known host compound used alone or a combination of two or more host compounds. The use of two or more host compounds makes it possible to control charge transfer and therefore to increase the efficiency of the organic electroluminescence element. Further, the use of two or more light-emitting materials that will be described later makes it possible to mix different emitted lights and therefore to obtain a desired emission color.

The host compound used for the light-emitting layer may be a conventionally-known low molecular compound, a high molecular compound having a repeating unit, or a low molecular compound having a polymerizable group such as a vinyl group or an epoxy group (vapor deposition polymerizable light-emitting host).

Examples of the host compound applicable to the present invention include compounds described in, for example, JP 2001-257076 A, JP 2001-357977 A, JP 2002-8860 A, JP 2002-43056A, JP 2002-105445 A, JP 2002-352957 A, JP 2002-231453 A, JP 2002-234888 A, JP 2002-260861 A, JP 2002-305083 A, US 2005/0112407 A, US 2009/0030202 A, WO 2001/039234 A, WO 2008/056746 A, WO 2005/089025 A, WO 2007/063754 A, WO 2005/030900 A, WO 2009/086028 A, WO 2012/023947 A, JP 2007-254297 A, and EP 2034538 B.

<Light-Emitting Material>

Examples of the light-emitting material that can be used in the present invention include a phosphorescence-emitting compound (also referred to as phosphorescent compound, phosphorescence-emitting material, or phosphorescence-emitting dopant) and a fluorescence-emitting compound (also referred to as fluorescent compound or fluorescence-emitting material).

<Phosphorescence-Emitting Compound>

The phosphorescence-emitting compound is a compound that emits light from the excited triplet state. More specifically, the phosphorescence-emitting compound is defined as a compound that emits phosphorescence at room temperature (25° C.) and has a phosphorescence quantum yield at 25° C. of 0.01 or higher. The phosphorescence quantum yield is preferably 0.1 or higher.

The phosphorescence quantum yield can be measured by a method described in p. 398 of Spectroscopy II of The Fourth Series of Experimental Chemistry 7 (published by Maruzen Publishing Co., Ltd. in 1992). The phosphorescence quantum yield in a solution can be measured using various solvents. However, when used in the present invention, the phosphorescence-emitting compound shall have a phosphorescence quantum yield of 0.01 or higher in any solvent.

The phosphorescence-emitting compound can be appropriately selected from known compounds used for the light-emitting layers of common organic EL elements, but is preferably a complex compound containing a metal of any of Groups 8 to 10 in the periodic table of elements, more preferably an iridium compound, an osmium compound, a platinum compound (platinum complex compound), or a rare-earth complex. Among them, an iridium compound is most preferred.

In the present invention, at least one light-emitting layer may contain two or more phosphorescence-emitting compounds, and the concentration ratio between the phosphorescence-emitting compounds in the light-emitting layer may be changed in the thickness direction of the light-emitting layer.

Specific examples of the known phosphorescence-emitting compound that can be used in the present invention include compounds described in the following literatures:

Nature 395, 151 (1998), Appl. Phys. Lett. 78, 1622 (2001), Adv. Mater. 19, 739 (2007), Chem. Mater. 17, 3532 (2005), Adv. Mater. 17, 1059 (2005), WO 2009/100991 A, WO 2008/101842 A, WO 2003/040257 A, US 2006/835469 A, US 2006/0202194 A, US 2007/0087321 A, and US 2005/0244673 A; Inorg. Chem. 40, 1704 (2001), Chem. Mater. 16, 2480 (2004), Adv. Mater. 16, 2003 (2004), Angew. Chem. Int. Ed. 2006, 45, 7800, Appl. Phys. Lett. 86, 153505 (2005), Chem. Lett. 34, 592 (2005), Chem. Commun. 2906 (2005), Inorg. Chem. 42, 1248 (2003), WO 2009/050290 A, WO 2009/000673 A, U.S. Pat. No. 7,332, 232, US 2009/0039776 A, U.S. Pat. No. 6,687,266, US 2006/0008670 A, US 2008/0015355 A, U.S. Pat. No. 7,396, 598, US 2003/0138657 A, and U.S. Pat. No. 7,090,928;

Angew. Chem. Int. Ed. 47, 1 (2008), Chem. Mater. 18, 5119 (2006), Inorg. Chem. 46, 4308 (2007), Organometallics 23, 3745 (2004), Appl. Phys. Lett. 74, 1361 (1999), WO 2006/056418 A, WO 2005/123873 A, WO 2005/123873 A, WO 2006/082742 A, US 2005/0260441 A, U.S. Pat. No. 7,534,505, US 2007/0190359 A, U.S. Pat. No. 7,338,722, U.S. Pat. No. 7,279,704, and US 2006/103874 A; and WO 2005/076380 A, WO 2008/140115 A, WO 2011/134013 A, WO 2010/086089 A, WO 2012/020327 A, WO 2011/051404 A, WO 2011/073149 A, JP 2009-114086 A, JP 2003-81988 A, and JP 2002-363552 A.

In the present invention, the phosphorescence-emitting compound is preferably an organometallic complex having Ir as a central metal. More preferably, the phosphorescence-emitting compound is a complex containing at least one coordination mode selected from a metal-carbon bond, a metal-nitrogen bond, a metal-oxygen bond, and a metal-sulfur bond.

The above-described phosphorescence-emitting compound (also referred to as phosphorescence-emitting metal complex) can be synthesized by any of methods disclosed in, for example, Organic Letter, Vol. 3, No. 16, pp. 2579 to 2581 (2001), Inorganic Chemistry, Vol. 30, No. 8, pp. 1685 to 1687 (1991), J. Am. Chem. Soc., Vol. 123, p. 4304 (2001), Inorganic Chemistry Vol. 40, No. 7, pp. 1704 to 1711 (2001), Inorganic Chemistry Vol. 41, No. 12, pp. 3055 to 3066 (2002), New Journal of Chemistry, Vol. 26, p. 1171 (2002), European Journal of Organic Chemistry Vol. 4, pp. 695 to 709 (2004), and reference literatures cited in these literatures.

<Fluorescence-Emitting Compound>

Examples of the fluorescence-emitting compound include coumarin-based dyes, pyran-based dyes, cyanin-based dyes, croconium-based dyes, squarylium-based dyes, oxobenzanthracene-based dyes, fluorescein-based dyes, rhodamine-based dyes, pyrylium-based dyes, perylene-based dyes, stilbene-based dyes, polythiophene-based dyes, and rare-earth complex-based phosphors.

[Organic Functional Layer Group]

Hereinbelow, layers constituting the organic functional layer unit will be described in the order of charge injection layer, hole transport layer, electron transport layer, and blocking layer.

(Charge Injection Layer)

A charge injection layer is a layer provided between an electrode and a light-emitting layer to reduce driving voltage or improve the luminance of emitted light, and details thereof are described in Chapter 2 "Electrode Materials" (pp. 123 to 166) in Section 2 of "Organic EL Element and Front Line of Industrialization Thereof (published by NTS Inc., Nov. 30, 1998) (hereinafter, referred to as Reference Literature 1). Examples of the charge injection layer include a hole injection layer and an electron injection layer.

In general, a hole injection layer as a charge injection layer can be provided between an anode and a light-emitting layer or a hole transport layer, and an electron injection layer as a charge injection layer can be provided between a cathode and a light-emitting layer or an electron transport layer. In the present invention, the charge injection layer is provided adjacent to a transparent electrode. When the electron injection layer and the hole injection layer are used for the intermediate electrode, at least one of the electron injection layer and the hole injection layer adjacent to the intermediate electrode shall satisfy the requirements of the present invention.

The hole injection layer is provided adjacent to the anode as a transparent electrode to reduce driving voltage or improve the luminance of emitted light, and details thereof are described in Reference Literature 1.

The hole injection layer is described in detail also in JP 9-45479 A, JP 9-260062 A, and JP 8-288069 A. Examples of a material used for the hole injection layer include porphyrin derivatives, phthalocyanine derivatives, oxazole derivatives, oxadiazole derivatives, triazole derivatives, imidazole derivatives, pyrazoline derivatives, pyrazolone derivatives, phenylenediamine derivatives, hydrazone derivatives, stilbene derivatives, polyarylalkane derivatives, triarylamine derivatives, carbazole derivatives, indolocarbazole derivatives, isoindole derivatives, acene-based derivatives such as anthracene and naphthalene, fluorene derivatives, fluorenone derivatives, polyvinyl carbazole, polymers or oligomers having an aromatic amine introduced in their main chain or side chain, polysilane, conductive polymers or oligomers (e.g., PEDOT (polyethylenedioxythiophene): PSS (polystyrenesulfonic acid), aniline-based copolymers, polyaniline, polythiophene).

Examples of the triarylamine derivatives include a bendizine-type derivative typified by α-NPD (4,4'-bis[N-(1-naphthyl)-N-phenylamino]biphenyl), a starburst-type derivative typified by MTDATA (4,4'4"-tris[N-(3-methylphenyl)-N-phenylamino]triphenylamine), and a compound having fluorene or anthracene in the connecting core of triarylamine.

Alternatively, a hexaazatriphenylene derivative such as one described in JP 2003-519432 W or JP 2006-135145 A can also be used as a hole transport material.

The electron injection layer is provided between the cathode and the light-emitting layer to reduce driving voltage or improve the luminance of emitted light. When the cathode is a transparent electrode according to the present invention, the electron injection layer is provided adjacent to the transparent electrode. The electron injection layer is described in detail in Reference Literature 1.

The electron injection layer is described in detail also in JP 6-325871 A, JP 9-17574 A, and JP 10-74586 A. Specific examples of a material preferably used for the electron injection layer include metals typified by strontium and aluminum, alkali metal compounds typified by lithium fluoride, sodium fluoride, and potassium fluoride, alkali metal halide layers typified by magnesium fluoride and calcium fluoride, alkaline earth metal compound layers typified by magnesium fluoride, metal oxides typified by molybdenum oxide and aluminum oxide, metal complexes typified by 8-hydroxyquinolato-lithium (Liq). When the cathode is a transparent electrode according to the present invention, an organic material such as a metal complex is particularly preferably used. The electron injection layer is preferably a very thin film. The thickness of the electron injection layer depends on its constituent material, but is preferably in the range of 1 nm to 10 μm.

(Hole Transport Layer)

A hole transport layer is made of a hole transport material having the function of transporting holes. In a broad sense, a hole injection layer and an electron blocking layer also function as the hole transport layer. The hole transport layer may be a single layer or composed of two or more layers.

The hole transport material has either a hole injection or transport property or an electron blocking property, and may be either organic or inorganic. Examples of the hole transport material include triazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, oxazole derivatives, styrylanthracene derivatives, fluorenone derivatives, hydrazone derivatives, stilbene derivatives, silazane derivatives, aniline-based copolymers, conductive polymers or oligomers, and thiophene oligomers.

The hole transport material may be any of the above materials. However, the hole transport material may be a porphyrin compound, an aromatic tertiary amine compound, or a styrylamine compound, and is particularly preferably an aromatic tertiary amine compound.

Typical examples of the aromatic tertiary amine compound and the styrylamine compound include N,N,N',N'-tetraphenyl-4,4'-diaminophenyl, N,N'-diphenyl-N,N'-bis(3-methylphenyl)-[1,1'-biphenyl]-4,4'-diamine (abbreviation: TPD), 2,2-bis(4-di-p-tolylaminophenyl)propane, 1,1-bis(4-di-p-tolylaminophenyl)cyclohexane, N,N,N',N'-tetra-p-tolyl-4,4'-diaminobiphenyl, 1,1-bis(4-di-p-tolylaminophenyl)-4-phenylcyclohexane, bis(4-dimethylamino-2-methylphenyl)phenylmethane, bis(4-di-p-tolylaminophenyl)phenylmethane, N,N'-diphenyl-N,N'-di(4-methoxyphenyl)-4,4'-diaminobiphenyl, N,N,N'.N'-tetraphenyl-4,4'-diaminodiphenyl ether, 4,4'-bis(diphenylamino)quardriphenyl, N,N,N-tri(p-tolyl)amine, 4-(di-p-tolylamino)-4'-[4-(di-p-tolylamino)styryl]stilbene, 4-N,N-diphenylamino-(2-diphenylvinyl)benzene, 3-methoxy-4'-N,N-diphenylaminostyrylbenzene, and N-phenylcarbazole.

The hole transport layer can be formed by forming the hole transport material into a thin film by a known method such as vacuum deposition, spin coating, casting, printing including ink-jet printing, or LB (Langmuir Blodgett) method. The thickness of the hole transport layer is not particularly limited, but is generally in the range of about 5 nm to 5 μm, preferably in the range of 5 to 200 nm. The hole transport layer may have a single-layer structure composed of one or two or more of the above materials.

The hole transport layer may be made of a material doped with an impurity so as to have a higher p property. Examples of such a hole transport layer include those described in JP 4-297076 A, JP 2000-196140 A, JP 2001-102175 A, and J. Appl. Phys., 95, 5773 (2004).

Such a hole transport layer having a higher p property is preferred in that an element with lower power consumption can be produced.

(Electron Transport Layer)

An electron transport layer is made of a material having the function of transporting electrons. In a broad sense, an electron injection layer and a hole blocking layer are also included in the electron transport layer. The electron transport layer may have a single-layer structure or a laminate structure of two or more layers.

In the electron transport layer having a single-layer structure or a laminate structure, an electron transport material (serving also as a hole blocking material) constituting a layer adjacent to the light-emitting layer shall have the function of transporting electrons injected from the cathode to the light-emitting layer. Such a material may be selected from any conventionally-known compounds. Examples of the electron transport material include nitro-substituted fluorene derivatives, diphenylquinone derivatives, thiopyrandioxide derivatives, carbodiimides, fluorenylidenemethane derivatives, anthraquinodimethane, anthrone derivatives, and oxadiazole derivatives. Further, the material of the electron transport layer may be a thiadiazole derivative obtained by substituting an oxygen atom in the oxadiazole ring of the oxadiazole derivative with a sulfur atom or a quinoxaline derivative having a quinoxaline ring known as an electron-withdrawing group. Further, the material of the electron transport layer may be a polymer material obtained by introducing any of the above materials into a polymer chain or a polymer material having any of the above materials as a main chain.

Further, the material of the electron transport layer may be a metal complex of 8-quinolinol derivative such as tris(8-quinolinol)aluminum (abbreviation: $Alq_3$), tris(5,7-dichloro-8-quinolinol)aluminum, tris(5,7-dibromo-8-quinolinol)aluminum, tris(2-methyl-8-quinolinol)aluminum, tris(5-methyl-8-quinolinol)aluminum, or bis(8-quinolinol) zinc (abbreviation: Znq) or a metal complex obtained by substituting the center metal of any of the above metal complexes with In, Mg, Cu, Ca, Sn, Ga, or Pb.

The electron transport layer can be formed by forming the above material into a thin film by a known method such as vacuum deposition, spin coating, casting, printing including ink-jet printing, or LB method. The thickness of the electron transport layer is not particularly limited, but is usually in the range of about 5 nm to 5 μm, preferably in the range of 5 to 200 nm. The electron transport layer may have a single-layer structure composed of one or two or more of the above materials.

(Blocking Layer)

Examples of a blocking layer include a hole blocking layer and an electron blocking layer. If necessary, the blocking layer is provided in addition to the above-described layers constituting the organic functional layer unit 4. For example, the blocking layer may be a hole blocking layer described in JP 11-204258 A, JP 11-204359 A, and p. 237 of "Organic EL Element and Front Line of Industrialization Thereof" (published by NTS Inc., Nov. 30, 1998).

In a broad sense, the hole blocking layer functions as an electron transport layer. The hole blocking layer is made of a hole blocking material having an electron transport function and a very low hole transportability, and therefore can transport electrons and block holes to improve the recombination probability of electrons and holes. If necessary, the structure of an electron transport layer may be used as the hole blocking layer. The hole blocking layer is preferably provided adjacent to the light-emitting layer.

On the other hand, in a broad sense, the electron blocking layer functions as a hole transport layer. The electron blocking layer is made of a material having a hole transport function and a very low electron transportability, and therefore can transport holes and block electrons to improve the recombination probability of electrons and holes. If necessary, the structure of a hole transport layer may be used as the electron blocking layer. The thickness of the hole blocking layer applied to the present invention is preferably in the range of 3 to 100 nm, more preferably in the range of 5 to 30 nm.

[Cathode]

The cathode is an electrode film that supplies holes to the organic functional layer group or the light-emitting layer, and is made of a metal, an alloy, an organic or inorganic conductive compound, or a mixture of two or more of them. Specific examples of such a material of the cathode include gold, aluminum, silver, magnesium, lithium, magnesium/copper mixtures, magnesium/silver mixtures, magnesium/aluminum mixtures, magnesium/indium mixtures, indium, lithium/aluminum mixtures, rare-earth metals, and oxide semiconductors such as ITO, ZnO, $TiO_2$, and $SnO_2$.

The cathode can be formed by forming such a conductive material into a thin film by a method such as vapor deposition or sputtering. The sheet resistance of the cathode as a second electrode is preferably several hundred ohms per square or less, and the thickness of the cathode is usually in the range of 5 nm to 5 μm, preferably in the range of 5 to 200 nm.

It is to be noted that when the organic EL element is a double-sided emission-type organic EL element in which emitted light L is extracted also from the cathode side, an electrode excellent in light permeability may be selected as the cathode.

[Sealing Member]

An example of a sealing means used to seal the organic EL element includes a method in which the sealing member, the cathode, and the transparent substrate are bonded together with an adhesive.

The sealing member may be either a concave plate or a flat plate as long as the sealing member is provided so as to cover the display region of the organic EL element. The transparency and electrical insulation property of the sealing member are not particularly limited.

Specific examples of the sealing member include a glass plate, a polymer plate or film, and a metal plate or film. Examples of the glass plate include soda lime glass, barium.strontium-containing glass, lead glass, aluminosilicate glass, borosilicate glass, barium borosilicate glass, and quartz. Examples of the polymer plate include polycarbonate, acrylics, polyethylene terephthalate, polyethersulfide, and polysulfone. The metal plate is made of at least one metal selected from the group consisting of stainless steel, iron, copper, aluminum, magnesium, nickel, zinc, chromium, titanium, molybdenum, silicon, germanium, and tantalum, or an alloy of two or more of them.

From the viewpoint of reducing the thickness of the organic EL element, the sealing member is preferably a polymer film or a metal film. Further, the polymer film preferably has a water vapor transmission rate of $1\times10^{-3}$ $g/m^2\cdot24h$ or less as measured at a temperature of $25\pm0.5°$ C. and a relative humidity of $90\pm2\%$ RH by a method based on JIS K 7129-1992, and more preferably has an oxygen transmission rate of $1\times10^{-3}$ $ml/m^2\cdot24$ h·atm (1 atm=$1.01325\times10^5$ Pa) or less as measured by a method based on JIS K 7126-1987 and a water vapor transmission rate of $1\times10^{-3}$ $g/m^2\cdot24$ h or less as measured at a temperature of $25\pm0.5°$ C. and a relative humidity of $90\pm2\%$ RH.

A gap between the sealing member and the display region (light-emitting region) of the organic EL element is preferably filled with an inert gas such as nitrogen or argon or an inert liquid such as fluorohydrocarbon or silicone oil to form a gas phase or a liquid phase. The gap between the sealing member and the display region of the organic EL element may be a vacuum or may be filled with a hygroscopic compound.

[Method for Producing Organic EL Element]

The organic EL element is produced by laminating, on a transparent base material, an anode, an organic functional layer group 1, a light-emitting layer, an organic functional layer group 2, and a cathode to form a laminated body.

First, a transparent base material is prepared. Then, on the transparent base material, a thin film made of a desired electrode material, e.g., an anode material is formed to have a thickness of 1 μm or less, preferably 10 to 200 nm by a method such as vapor deposition or sputtering to form an anode. At the same time, a connecting electrode to be connected to an external power supply is formed at the end of the anode.

Then, a hole injection layer and a hole transport layer constituting an organic functional layer group 1, a light-emitting layer, and an electron transport layer constituting an organic functional layer group 2 are laminated in order on the anode.

Each of these layers can be formed by a method such as spin coating, casting, ink-jetting, vapor deposition, or printing, but is particularly preferably formed by vacuum vapor deposition or spin coating because a homogeneous layer can be easily obtained and pin holes are less likely to be formed.

These different layers may be formed by different methods. When each of these layers is formed by vapor deposition, the conditions of vapor deposition vary depending on the type of compound used, but are preferably a boat heating temperature of 50 to 450° C., a degree of vacuum of $1\times10^{-6}$ to $1\times10^{-2}$ Pa, a deposition rate of 0.01 to 50 nm/sec, a substrate temperature of −50 to 300° C., and a layer thickness of 0.1 to 5 μm.

After the organic functional layer group 2 is formed in the above manner, a cathode is formed by an appropriate method such as vapor deposition or sputtering on the organic functional layer group 2. At this time, the cathode is insulated from the anode by the organic functional layer groups, and is patterned so that the terminal of the cathode is extracted from above the organic functional layer group to the edge of the transparent substrate.

After the cathode is formed, these transparent base material, anode, organic functional layer groups, light-emitting layer, and cathode are sealed with a sealing material. More specifically, a sealing member is provided on the transparent base material so as to cover at least the organic functional layers in a state where the terminals of the anode and the cathode are exposed.

<<Smart Device>>

Figure 7:
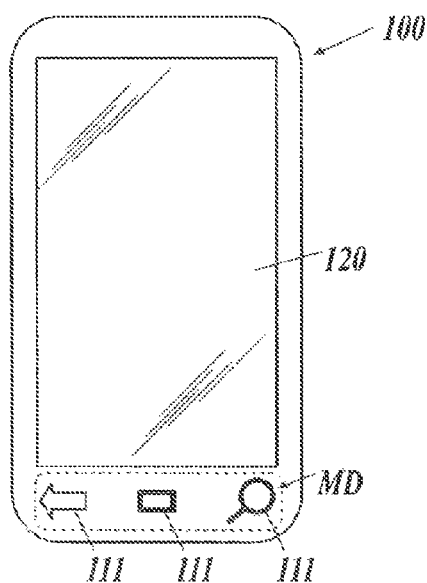
FIG. 7 is a schematic view illustrating one example of a smart device equipped with the organic EL module according to the present invention.

FIG. 7 is a schematic view illustrating one example of a smart device equipped with the organic EL module according to the present invention.

A smart device 100 according to the present invention includes the organic EL module (MD) having a touch-sensing function and described with reference to FIGS. 1 to 6 and a liquid crystal display (120). The liquid crystal display (120) may be a conventionally-known liquid crystal display.

FIG. 7 illustrates a state where the organic EL module (MD) according to the present invention emits light, wherein lights emitted from various display patterns (111) are visually recognized from the front side. When the organic EL module (MD) is in a non-light-emitting state, the various display patterns (111) are not visually recognized. It is to be noted that the shapes of the display patterns (111) illustrated in FIG. 7 are merely examples and are not limited thereto, and the display patterns (111) may be any graphics, letters, or marks. Here, the "display pattern" refers to a pattern (design or mark), letter, image, or the like displayed by light emitted from the organic EL element.

EXAMPLES

Hereinbelow, the present invention will be specifically described with reference to examples, but the present invention is not limited to these examples. It is to be noted that "%" used in the examples is "vol %" unless otherwise specified.

<<Production of Organic EL Module 1: Present Invention>>

[Production of Organic EL Panel 1]

As illustrated in FIGS. 1A, 1B, and 2, an anode (52) was formed in a position corresponding to a light-emitting region (3) on a transparent base material (4, polyethylene terephthalate film manufactured by Teijin Dupont Films Japan Limited, Super transparent PET Type K, hereinafter abbreviated as PET film) having a size of 8.3 mm×10.5 mm and a thickness of 125 μm by patterning ITO (indium tin oxide) to have a size of 4.0 mm×5.0 mm and a thickness of 150 nm. Further, as illustrated in FIGS. 1A, 1B, and 2, connecting electrodes (5) were formed by ITO.

Then, the transparent base material (4) having the anode (52) made of ITO was ultrasonically washed with isopropyl alcohol, dried with dry nitrogen gas, and UV-ozone cleaned for 5 minutes. Then, the transparent base material was fixed to a substrate holder in a commercially-available vacuum deposition apparatus.

Optimum amounts of constituent materials of layers were placed in vapor deposition crucibles in the vapor deposition apparatus. The vapor deposition crucibles were made of a material for resistive heating such as molybdenum or tungsten.

After the pressure was reduced to achieve a degree of vacuum of $1\times10^{-4}$ Pa, the vapor deposition crucible containing the following compound M-4 was electrically heated to evaporate the compound M-4 onto the anode (52) on the transparent base material (4) at a deposition rate of 0.1 nm/sec to provide an electron injection layer having a thickness of 15 nm. Then, the following compound M-2 was evaporated in the same manner to provide an electron transport layer having a thickness of 40 nm. In this way, an organic functional layer group 1 (53A) was laminated.

Then, the following compounds BD-1, GD-1, RD-1, H-1, and H-2 were co-evaporated at a deposition rate of 0.1 nm/sec so that the concentrations of the compounds BD-1, GD-1, and RD-1 were 5%, 17%, and 0.8%, respectively to form a white light-emitting layer (54) having a thickness of 30 nm.

Then, the following compound E-1 was evaporated at a deposition rate of 0.1 nm/sec to provide an electron transport layer (organic functional layer group 2 (53B)) having a thickness of 30 nm.

[Chemical Formula 1]

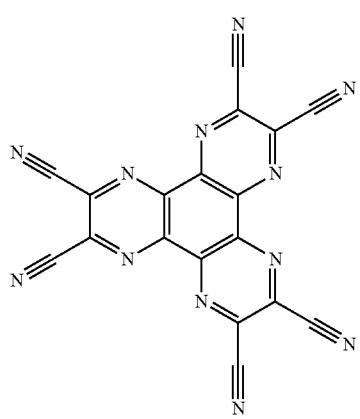

M-4

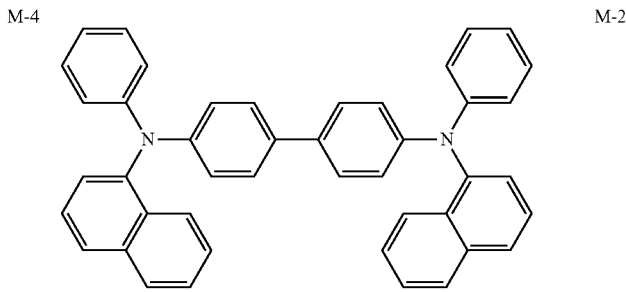

M-2

[Chemical Formula 2]

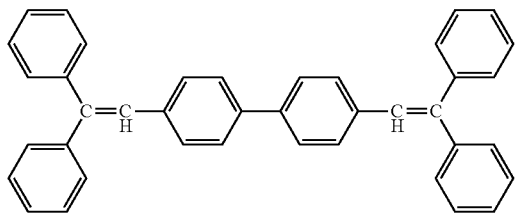
BD-1

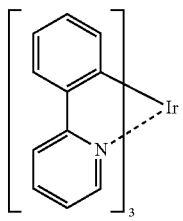
GD-1

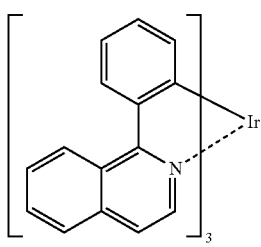
RD-1

[Chemical Formula 3]

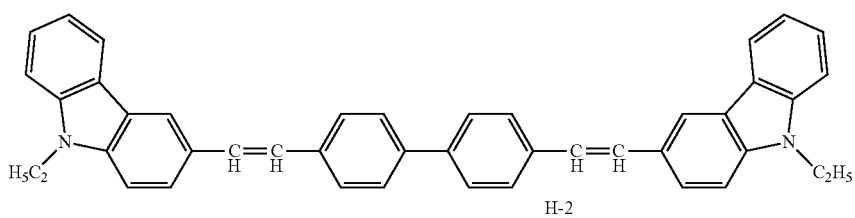
H-1

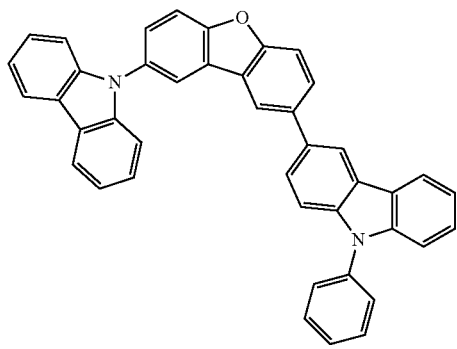
H-2

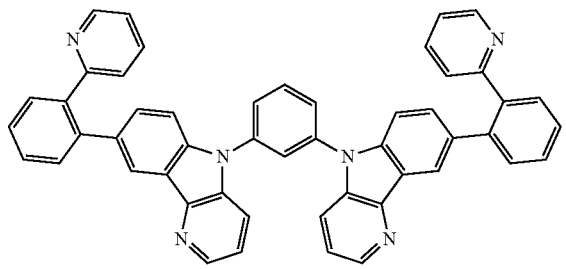
E-1

Further, LiF was formed to have a thickness of 1.5 nm, and then aluminum was evaporated to form a cathode (55) having a thickness of 110 nm.

Then, a polysilazane-containing liquid was applied on a 125 μm-thick polyethylene terephthalate film (manufactured by Teijin Dupont Films Japan Limited, Super transparent PET Type K) that was the same as that used as the transparent base material, and was then treated with an excimer lamp to form a gas barrier layer to obtain a transparent sealing member (57) with gas barrier layer.

The transparent sealing member was bonded to an organic EL element 101 so that its gas barrier layer was located on the organic EL element side by vacuum pressing using an epoxy-based thermosetting adhesive as a sealing adhesive (56) (ELEPHANE CS manufactured by TOMOEGAWA CO., LTD.) in a glove box with an oxygen concentration of 10 ppm or less and a moisture concentration of 10 ppm or less under conditions where vacuum suction ($1 \times 10^{-3}$ MPa or less) was performed for 20 seconds and pressing was performed for 20 seconds at 80° C. under a load of 0.04 MPa.

Then, in the glove box, the adhesive layer was thermally cured by heating for 30 minutes on a hot plate at 110° C. In this way, an organic EL panel 1 having a structure illustrated in FIGS. 1A and 1B was produced whose transparent base material (4) had a size of 8.3 mm×10.5 mm, sealing structure (2) had a size of 8.3 mm×5.6 mm, and light-emitting region (3) of the organic EL element had a size of 4.0 mm×5.0 mm.

[Production of Electrical Connecting Unit (FPC) 1]

An electrical connecting unit (FPC) 1 having a structure illustrated in FIGS. 3A to 3C was produced.

As an original board for electrical connecting unit (FPC), a double-sided copper-clad board was used which was obtained by forming a 12 μm-thick first copper layer (corresponding to 11A) and a 12 μm-thick second copper layer (corresponding to 11B) on both surfaces of a 38 μm-thick polyimide (PI) film.

Then, a photoresist material was applied on the copper layers on both surfaces of the double-sided copper-clad board. The both surfaces were subjected to exposure using a mask to obtain wiring patterns illustrated in FIGS. 3A to 3C and then subjected to development. Then, the unnecessary resist was removed to form resist patterns on the front and back surfaces.

Then, the copper layers were immersed in an etchant to form a capacitive sensing circuit (11A) and a back-side wiring part (11B) illustrated in FIGS. 3A to 3C on the both surfaces.

Then, drilled holes were formed in positions where through holes (9) were to be formed, and the surfaces of the drilled holes were given copper plating to electrically connect together the capacitive sensing circuit (corresponding to 11A) and the back-side wiring part (corresponding to 11B).

Finally, an opening (T), cuts (10), and a flap (6) were formed by opening holes at positions illustrated in FIGS. 3A to 3C using a pinnacle die.

The sizes of components of the electrical connecting unit (FPC) 1 illustrated in FIG. 4 are as follows.

L1: 18 mm
L2: 7 mm
L3: 5 mm
L4: 14 mm
L5: 4 mm

[Assembly of Organic EL Module (MD) 1]

An organic EL module (MD) 1 having a structure illustrated in FIGS. 5A to 5C was produced using the electrical connecting unit (FPC) 1 and organic EL panel (1)1 produced above.

Lands (8) of the electrical connecting unit (FPC) 1 and connecting electrodes (5) of the organic EL panel (1)1 were connected to each other using an anisotropic conductive film (ACF) as an electrically-connecting member (7). As the anisotropic conductive film, CP920AM-16AC (manufactured by Dexerials Corporation) was used. First, the ACF was temporarily laminated on the connecting electrodes of the organic EL panel 1 at 80° C. and 0.2 MPa. The temporary lamination of the ACF was performed using an ACF laminator LD-02 (manufactured by OHASHI ENGINEERING CO., LTD.). Then, the lands (8) of the electrical connecting unit were aligned with the connecting electrodes, and were then finally pressure-bonded to the connecting electrodes (5) at 2 MPa and 135° C. for 15 seconds using an ACF bonder BD-02 (manufactured by OHASHI ENGINEERING CO., LTD.).

[Evaluation of Smart Device Equipped with Organic EL Module 1]

The organic EL module (MD) 1 produced above was incorporated into a smart device. As a result, a small format was achieved, the organic EL module (MD) 1 could be reliably incorporated into a smart device, and excellent touch-sensing performance could be achieved.

Production of Organic EL Module 2: Comparative Example 1

[Production of Electrical Connecting Unit (FPC) 2]

An electrical connecting unit (FPC) 2 was produced in the same manner as in the production of the electrical connecting unit (FPC) 1 except that cuts (10) and a flap (6) were not formed.

[Assembly of Organic EL Module 2]

Figure 8:
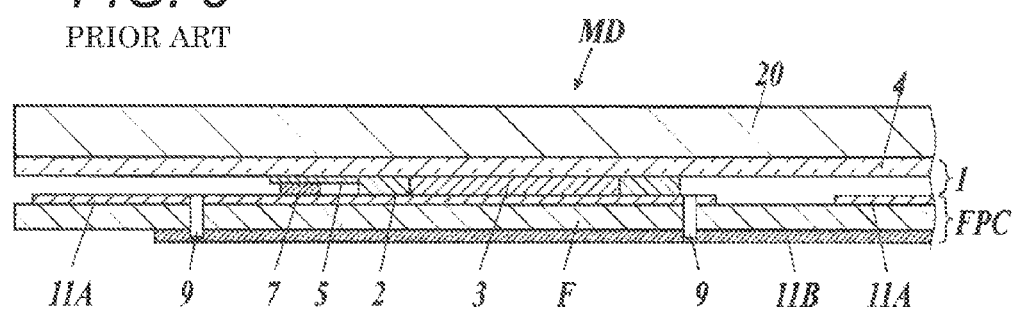
FIG. 8 is a schematic sectional view illustrating one example of the structure of an organic EL module as a comparative example.

An organic EL module (MD) 2 illustrated in FIG. 8 was produced by laminating a glass base material, the organic EL panel (1)1, and the electrical connecting unit (FPC) 2 in this order.

More specifically, the organic EL panel 1(1) was provided under the glass substrate (20), and the electrical connecting unit (FPC) 2 produced above was provided under the organic EL panel 1(1). Then, the connecting electrodes (5) of the organic EL panel (1) and the capacitive sensing circuit (11A) of the electrical connecting unit (FPC) that were opposed to each other were connected to each other using an anisotropic conductive film (ACF) as an electrically-connecting member (7).

[Evaluation of Smart Device Equipped with Organic EL Module 2]

The organic EL module 2 produced above was incorporated into a smart device. As a result, a small format was achieved to some extent, but touch-sensing accuracy was very low and noise generation was also caused because the organic EL panel (1) was present between the glass base material and the electrical connecting unit (FPC), and therefore a touch-sensing function could not be accurately performed. More specifically, the cathode electrode layer was present on the inner side of the organic EL module 2, and therefore a change in self-capacitance caused by a touch was at an undetectable level and was buried in surrounding noise. As a result, the absolute value of a change in capacitance could not be detected.

Production of Organic EL Module 3: Comparative Example 2

[Production of Electrical Connecting Unit (FPC) 3]

Figure 9:
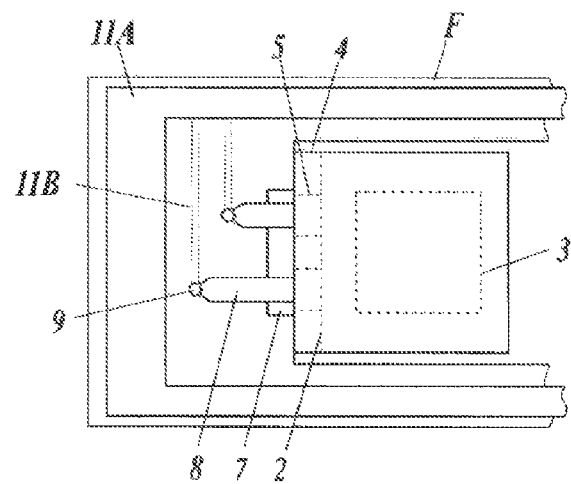
FIG. 9 is a schematic top view illustrating another example of the structure of the organic EL module as a comparative example.

An electrical connecting unit (FPC) 3 illustrated in FIG. 9 was produced in the same manner as in the production of the electrical connecting unit (FPC) 1 except that cuts (10) and a flap (6) were not formed and that the capacitive sensing circuit (11A) was provided along the periphery of the organic EL panel 1 so as not to overlap with the organic EL panel 1.

The size of the electrical connecting unit (FPC) 3 (L2 illustrated in FIG. 4) was twice the size of the electrical connecting unit (FPC) 1.

[Assembly of Organic EL Module 3]

An organic EL module 3 having a structure illustrated in FIG. 9 was produced using the electrical connecting unit (FPC) 3 and organic EL panel 1 produced above by laminating a glass base material, the electrical connecting unit (FPC) 3, and the organic EL panel 1 in this order.

[Evaluation of Smart Device Equipped with Organic EL Module 3]

The organic EL module 3 produced above was incorporated into a smart device. As a result, a touch-sensing function could be performed to some extent, but the organic EL module 3 was larger in size per pixel than the organic EL module 1. Therefore, the organic EL module 3 had a problem with size when incorporated into a smart device. Particularly, it became clear that there was a problem of mechanical interference with main display.

INDUSTRIAL APPLICABILITY

The organic EL module according to the present invention achieves a small format and a reduction in thickness, has a high touch-sensing accuracy, and is applicable to smart devices, and is therefore suitable for use in various smart devices such as smartphones and tablets.

REFERENCE SIGNS LIST

1 Organic electroluminescence panel, Organic EL panel
2 Sealing structure
3 Light-emitting region (of organic EL element)
4 Transparent base material 5 Connecting electrode
6 Flap
7 Electrically-connecting member
8 Land
9 Through hole
10 Cut
11A, 11A1, 11A2 Capacitive sensing circuit
11B Back-side wiring part
20 Glass substrate
52 Anode
53A Organic functional layer group 1
53B Organic functional layer group 2
54 Light-emitting layer
55 Cathode
56 Sealing adhesive
57 Sealing member
100 Smart device
111 Display pattern
120 Liquid crystal display
F Flexible substrate
FPC Electrical connecting unit (flexible printed circuit)
L Light-emitting surface
MD Organic electroluminescence module, Organic EL module
T Light-permeable part (opening)

The invention claimed is:

1. An organic electroluminescence module comprising:
an organic electroluminescence panel having a light emitting surface side, a back surface side, and a connecting electrode; and
an electrical connecting unit laminated on the organic electroluminescence panel, wherein
the electrical connecting unit has a flexible substrate and a capacitive sensing circuit provided on the flexible substrate and having a land,
the electrical connecting unit is provided on the light-emitting surface side of the organic electroluminescence panel,
the electrical connecting unit has a light-permeable part and a bent part formed by making two or more cuts in at least one side of the light-permeable part, the bent part including a flap that is bent toward the back surface side of the organic electroluminescence panel, and the land constituting the sensing circuit and the connecting electrode of the organic electroluminescence panel are electrically connected to each other at the bent part.

2. The organic electroluminescence module according to claim 1, wherein the bent part extends to and is formed on the back surface side, which is opposite to the light-emitting surface of the organic electroluminescence panel.

3. The organic electroluminescence module according to claim 1, wherein the electrical connecting unit has a light-permeable opening in a region overlapping with at least the organic electroluminescence panel.

4. The organic electroluminescence module according to claim 3, wherein the capacitive sensing circuit constituting the electrical connecting unit is provided along a periphery of the light-permeable opening, on a pair of opposite sides of the light-permeable opening, or on at least one side of the light-permeable opening.

5. The organic electroluminescence module according to claim 1, wherein the electrical connecting unit is provided on the light-emitting surface side of the organic electroluminescence panel and in a region overlapping with the organic electroluminescence panel.

6. The organic electroluminescence module according to claim 1, wherein the organic electroluminescence panel comprises an organic electroluminescence element, and the organic electroluminescence element has a pair of planar electrodes opposed to each other.

7. The organic electroluminescence module according to claim 1, wherein a member electrically connecting together the land constituting the sensing circuit and the connecting electrode of the organic electroluminescence panel is an anisotropic conductive film, a conductive paste, or a metal paste.

8. The organic electroluminescence module according to claim 1, wherein two or more organic electroluminescence panels are arranged in parallel.

9. A smart device comprising the organic electroluminescence module according to claim 1.

10. The organic electroluminescence module according to claim 2, wherein the electrical connecting unit has a light-permeable opening in a region overlapping with at least the organic electroluminescence panel.

11. The organic electroluminescence module according to claim 2, wherein the electrical connecting unit is provided on the light-emitting surface side of the organic electroluminescence panel and in a region overlapping with the organic electroluminescence panel.

12. The organic electroluminescence module according to claim 2, wherein the organic electroluminescence panel comprises an organic electroluminescence element, and the organic electroluminescence element has a pair of planar electrodes opposed to each other.

13. The organic electroluminescence module according to claim 2, wherein a member electrically connecting together the land constituting the sensing circuit and the connecting electrode of the organic electroluminescence panel is an anisotropic conductive film, a conductive paste, or a metal paste.

14. The organic electroluminescence module according to claim 2, wherein two or more organic electroluminescence panels are arranged in parallel.

15. A smart device comprising the organic electroluminescence module according to claim 2.

16. The organic electroluminescence module according to claim 3, wherein the electrical connecting unit is provided on the light-emitting surface side of the organic electroluminescence panel and in a region overlapping with the organic electroluminescence panel.

17. The organic electroluminescence module according to claim 3, wherein the organic electroluminescence panel comprises an organic electroluminescence element, and the organic electroluminescence element has a pair of planar electrodes opposed to each other.

18. The organic electroluminescence module according to claim 3, wherein a member electrically connecting together the land constituting the sensing circuit and the connecting electrode of the organic electroluminescence panel is an anisotropic conductive film, a conductive paste, or a metal paste.

19. The organic electroluminescence module according to claim 3, wherein two or more organic electroluminescence panels are arranged in parallel.

20. A smart device comprising the organic electroluminescence module according to claim 3.

* * * * *